United States Patent
Lim et al.

(10) Patent No.: US 11,042,089 B2
(45) Date of Patent: Jun. 22, 2021

(54) CHEMICALLY AMPLIFIED PHOTORESIST COMPOSITION, PHOTORESIST PATTERN, AND METHOD FOR PREPARING PHOTORESIST PATTERN

(71) Applicant: LG CHEM, LTD., Seoul (KR)

(72) Inventors: Min Young Lim, Daejeon (KR); Ji Hye Kim, Daejeon (KR); Yongmi Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 53 days.

(21) Appl. No.: 16/488,515

(22) PCT Filed: Sep. 14, 2018

(86) PCT No.: PCT/KR2018/010869
§ 371 (c)(1),
(2) Date: Aug. 23, 2019

(87) PCT Pub. No.: WO2019/054805
PCT Pub. Date: Mar. 21, 2019

(65) Prior Publication Data
US 2020/0233302 A1    Jul. 23, 2020

(30) Foreign Application Priority Data

Sep. 15, 2017  (KR) ......................... 10-2017-0118879
Sep. 12, 2018  (KR) ......................... 10-2018-0109090

(51) Int. Cl.
*G03F 7/039* (2006.01)
*G03F 7/20* (2006.01)

(52) U.S. Cl.
CPC .............. *G03F 7/0397* (2013.01); *G03F 7/20* (2013.01)

(58) Field of Classification Search
CPC ........ G03F 7/0397; G03F 7/20; G03F 7/0392; G03F 7/0045; G03F 7/038; G03F 7/039; G03F 7/2004; C07D 221/14
USPC ...................................................... 430/270.1
See application file for complete search history.

(56) References Cited

U.S. PATENT DOCUMENTS

| | | |
|---|---|---|
| 8,329,377 B2 | 12/2012 | Takemoto et al. |
| 8,680,268 B2 | 3/2014 | Murai et al. |
| 9,244,345 B1 | 1/2016 | Ishimaru et al. |
| 9,436,085 B2 | 9/2016 | Horiguchi et al. |
| 2010/0028807 A1 | 2/2010 | Takemoto et al. |
| 2011/0269074 A1 | 11/2011 | Aqad et al. |
| 2011/0274853 A1 | 11/2011 | Park et al. |
| 2013/0337380 A1 | 12/2013 | Liu et al. |
| 2015/0086912 A1 | 3/2015 | Kawabata et al. |
| 2016/0085148 A1 | 3/2016 | Zhang et al. |
| 2016/0368879 A1 | 12/2016 | Ikeda et al. |

FOREIGN PATENT DOCUMENTS

| | | | |
|---|---|---|---|
| CN | 102884479 A | 1/2013 | |
| EP | 3182203 A1 | 6/2017 | |
| JP | 2006-234938 A | 9/2006 | |
| JP | 2010053121 * | 3/2010 | ............ G03F 7/004 |
| JP | 2012-013962 A | 1/2012 | |
| JP | 2014-006503 A | 1/2014 | |
| JP | 2015-031842 A | 2/2015 | |
| JP | 5673960 B2 | 2/2015 | |
| JP | 2015031842 * | 2/2015 | ............ G03F 7/004 |
| JP | 2015-105240 A | 6/2015 | |
| JP | 5782283 B2 | 9/2015 | |
| KR | 10-2007-0017962 A | 2/2007 | |
| KR | 10-2011-0110047 A | 10/2011 | |
| KR | 10-2012-0101533 A | 9/2012 | |
| KR | 10-2015-0016087 A | 2/2015 | |
| KR | 10-2015-0032523 A | 3/2015 | |
| KR | 10-2016-0030210 A | 3/2016 | |
| KR | 10-1633798 B1 | 7/2016 | |
| KR | 10-2016-0107951 A | 9/2016 | |
| KR | 10-2017-0042726 A | 4/2017 | |
| KR | 10-1725471 B1 | 4/2017 | |
| TW | 201006798 A1 | 2/2010 | |
| TW | 201139380 A | 11/2011 | |
| TW | 201613862 A | 4/2016 | |
| WO | 2014-073409 A1 | 5/2014 | |
| WO | 2016-010077 A1 | 1/2016 | |
| WO | 2017-034814 A1 | 3/2017 | |

OTHER PUBLICATIONS

International Search Report and Written Opinion issued for international application No. PCT/KR2018/010869 dated Jan. 7, 2019, 12 pages.

* cited by examiner

*Primary Examiner* — Caleen O Sullivan
(74) *Attorney, Agent, or Firm* — Rothwell, Figg, Ernst & Manbeck, P.C.

(57) ABSTRACT

The present invention relates to a chemically amplified photoresist composition including an alkali-soluble resin and a polymeric photo-acid generator having a predetermined structure, a photoresist pattern produced from the chemically amplified photoresist composition, and a method for preparing the chemically amplified photoresist pattern.

16 Claims, No Drawings

US 11,042,089 B2

CHEMICALLY AMPLIFIED PHOTORESIST COMPOSITION, PHOTORESIST PATTERN, AND METHOD FOR PREPARING PHOTORESIST PATTERN

CROSS-REFERENCE TO RELATED APPLICATION(S)

This application is a 35 U.S.C. § 371 National Phase Entry Application from PCT/KR2018/010869, filed on Sep. 14, 2018, and designating the United States, which claims priority to and the benefits of Korean Patent Application Nos. 10-2017-0118879, filed on Sep. 15, 2017, and 10-2018-0109090, filed on Sep. 12, 2018, with the Korean Intellectual Property Office, the disclosures of which are incorporated herein by reference in their entireties.

TECHNICAL FIELD

The present invention relates to a chemically amplified photoresist composition, a photoresist pattern, and a method for preparing the photoresist pattern.

BACKGROUND ART

As the application of microfabrication technologies of FAB processes is expanding, packaging technology is also changing to process technology for manufacturing a high performance, thin, and small-sized package.

In particular, due to an increase in the number of semiconductor input/output terminals, the application of flip chips has expanded, FOWLP technology has been introduced, and a TSV process capable of direct connection between chips has expanded for the purpose of minimizing signal delay. Thereby, demand for bump is growing, and technology development of bump PR for forming it is very important.

In the case of bump PR, the sensitivity and resolution in a thick film from 10 to 100 μm must be very good, and a metal bump must be formed through a plating process. Thus, pattern performance such as straightness, residues, footing, or notching characteristics must be good, and resistance to a plating solution should be excellent.

Therefore, in order to enhance sensitivity and resolution in a thick film, a chemically amplified photoresist composition is used, and this composition is known to include a resin capable of increasing solubility in an alkali developing solution by the dissociation of an acid, a photosensitive acid generator (photo-acid generator), an acid diffusion control agent, a corrosion inhibitor, and a specific dissolution inhibitor.

On the other hand, according to the prior art, a naphthalimide-type photo-acid generator is used. In this case, the solubility is not good and thus the content should be increased in order to increase sensitivity. However, this has limitations, and there is a drawback that scum remains in the exposure part after development.

Therefore, there is a need for research on a photo-acid generator capable of remedying the above-described drawbacks.

DETAILED DESCRIPTION OF THE INVENTION

Technical Problem

The present invention has been made to solve the above problems, and it is therefore an object of the invention to provide a chemically amplified photoresist composition which improves compatibility between an alkali-soluble resin and a photo-acid generator and the solubility of the photo-acid generator, and thereby effectively increases the sensitivity even if a small amount of a photo-acid generator is used, prevents the occurrence of scum in the exposed area during development due to excessive use of the photo-acid generator, and further improves resistance to a leaching phenomenon in which a low-molecular substance leaks out into a plating solution.

It is another object of the invention to provide a photoresist pattern produced from the above-described chemically amplified photoresist composition.

It is a further object of the invention to provide a method for preparing a photoresist pattern using the above-described chemically amplified photoresist composition.

Technical Solution

In order to achieve the above objects, there is provided a chemically amplified photoresist composition comprising: a first alkali-soluble resin; and a polymeric photo-acid generator in which a photo-acid generating group is linked with a second alkali-soluble resin via a functional group containing a $C_{1-20}$ alkylene sulfide.

There is also provided a photoresist pattern produced from the chemically amplified photoresist composition.

In addition, there is provided a method for preparing a photoresist pattern including: a lamination step of laminating a thick film photoresist layer composed of the chemically amplified photoresist composition on a support; an exposure step of irradiating the thick film photoresist layer with radiation including electromagnetic waves or a particle beam; and a development step of developing the thick film photoresist layer after exposure to obtain a thick film resist pattern.

Hereinafter, a photo-acid generator according to a specific embodiment of the present invention, a chemically amplified photoresist composition for a thick film including the photo-acid generator, and a photoresist pattern produced therefrom will be described in detail.

Meanwhile, the term "functional group containing a $C_{1-20}$ alkylene sulfide" as used in the claims and specification of the present invention shall be understood to mean a straight-chain $C_{1-20}$ alkylene functional group having a thiol at the terminal, and the point of attachment to another functional group or a group is the terminal of the other alkyl excluding the terminal to which the thiol is attached.

In addition, the term "ethylene sulfide group" shall be understood to mean a functional group in which a sulfur (S) element is attached to one straight-chain alkylene having 2 carbon atoms.

Further, the term "alkenethiol" shall be understood to mean a functional group having a structure in which a thiol is linked to a divalent functional group derived from an alkene. Meanwhile, the term "alkali-soluble resin" as used in the claims and specification of the present invention shall be understood to mean a resin in which a leaving group is de-protected by light to thereby have alkali-soluble properties.

Further, in the present specification, the notation

means a bond connected to another substituent group.

In the present specification, the terms "first" and "second" shall be understood to mean that an arbitrary order has been given to distinguish the two.

As described above, according to one embodiment of the invention, a chemically amplified photoresist composition may be provided, including: a first alkali-soluble resin; and a polymeric photo-acid generator in which a photo-acid generating group is linked with a second alkali-soluble resin via a functional group containing a $C_{1-20}$ alkylene sulfide.

As a result of studies made by the present inventors, it has been found through experiments that the chemically amplified photoresist composition of the embodiment can improve compatibility between an alkali-soluble resin and a photo-acid generator and the solubility of the photo-acid generator, and also effectively increases sensitivity even if a small amount of a photo-acid generator is used and thus prevents the occurrence of scum in the exposed area during the development due to excessive use of the photo-acid generator, and further improves resistance to a leaching phenomenon in which a low-molecular substance leaks out into a plating solution.

More specifically, the polymeric photo-acid generator contained in the chemically amplified photoresist composition of the embodiment has a structure in which a second alkali-soluble resin is linked with a photo-acid generating group via an ethylene sulfide functional group. Thereby, even if a relatively small amount of a photo-acid generator is used, it is possible to increase compatibility between an alkali-soluble resin and a photo-acid generator, to improve the solubility of the photo-acid generator, and to effectively increase the sensitivity and thus prevent the occurrence of scum in the exposed area during the development due to excessive use of the photo-acid generator.

In addition, since a conventional chemically amplified photoresist composition uses a low molecular weight compound as a photo-acid generator, a leaching phenomenon occurs in which a low molecular substance such as a photo-acid generator leaks out into a plating solution. In contrast, the chemically amplified photoresist composition of the embodiment of the invention includes a polymeric photo-acid generator having a relatively bulky structure and thereby can prevent the above-mentioned leaching phenomenon.

In the polymeric photo-acid generator, the second alkali-soluble resin substituted with at least one selected among a functional group containing a double bond at the terminal and a functional group containing a thiol is linked with the photo-acid generator via a thiol-ene click reaction to produce a photo-acid generator having a structure in which the photo-acid generating group is linked with the second alkali-soluble resin via an ethylene sulfide functional group.

Specifically, when a functional group containing a double bond is substituted at the terminal of the second alkali-soluble resin, the photo-acid generating group is derived from a compound that may have a functional group including a thiol. When a functional group containing a thiol is substituted at the terminal of the second alkali-soluble resin, the photo-acid generating group is derived from a compound that may have a functional group containing a double bond.

More specifically, when the second alkali-soluble resin is polymerized and then the photo-acid generating group and the photo-initiator are added thereto, a thiol-ene click reaction occurs between the double bond and the thiol functional group.

The second alkali-soluble resin polymerized by the above reaction and the photo-acid generating group are linked via an ethylene sulfide functional group to produce a photo-acid generator, and contained in the photoresist composition in such a form. Hereinafter, the chemically amplified photoresist composition of the embodiment will be described in more detail.

Alkali-Soluble Resin

Specifically, each of the first alkali-soluble resin and the second alkali-soluble resin is a polymer resin having an acid group protected by a protecting group, and the acid group may be, for example, a carboxyl group, a phenolic hydroxyl group, or the like.

Resins that can be used herein may each independently be a polymer resin commonly known in the art, and examples thereof include an acrylic resin, a novolac resin, and a polyhydroxystyrene resin, but are not limited thereto.

The first alkali-soluble resin and the second alkali-soluble resin may each independently be at least one selected from the group consisting of an acrylic resin, a novolac resin, and a polyhydroxystyrene resin.

Specific features of the second alkali-soluble resin contained in the polymeric photo-acid generator are not limited, but considering the compatibility of the components in the chemically amplified photoresist composition of the embodiment and the physical properties and homogeneity of the finally produced photoresist pattern, the second alkali-soluble resin contained in the polymeric photo-acid generator may be the same as that of the first alkali-soluble resin or may contain a repeating unit that is the same repeating unit contained in the first alkali-soluble resin.

The chemically amplified photoresist composition of the embodiment may include the first alkali-soluble resin and the polymeric photo-acid generator in consideration of physical properties and specific uses of the photoresist pattern to be finally produced. For example, the chemically amplified photoresist composition of the embodiment may include 0.01 to 50 parts by weight of the polymeric photo-acid generator based on 100 parts by weight of the first alkali-soluble resin.

More specifically, each of the first alkali-soluble resin and the second alkali-soluble resin may include a structure derived from any one or more of monomers represented by the following Chemical Formulae 1 to 10.

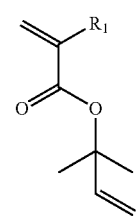

[Chemical Formula 1]

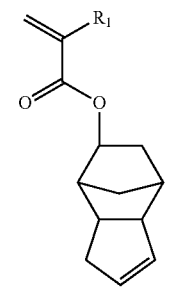

[Chemical Formula 2]

[Chemical Formula 3]

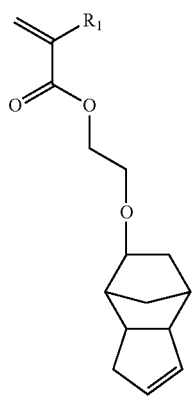

[Chemical Formula 4]

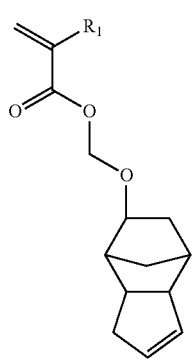

[Chemical Formula 5]

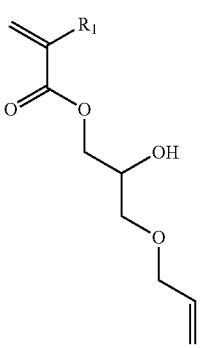

[Chemical Formula 6]

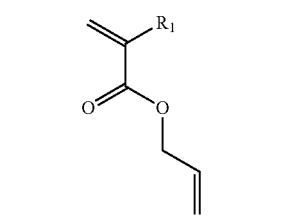

[Chemical Formula 7]

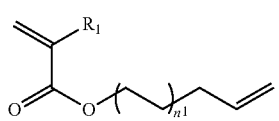

[Chemical Formula 8]

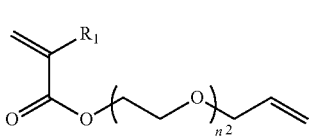

[Chemical Formula 9]

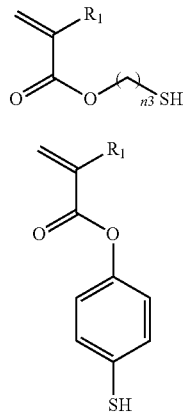

[Chemical Formula 10]

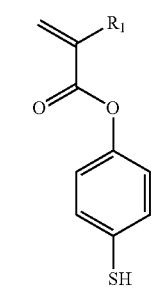

In Chemical Formulae 1 to 10, $R_1$ is hydrogen, a halogen, a $C_{1-10}$ alkyl, a $C_{3-10}$ cycloalkyl, or a $C_{2-10}$ alkenyl, and n1, n2, and n3 may each independently be an integer of 1 to 18.

Polymeric Photo-Acid Generator

The photo-acid generating group contained in the polymeric photo-acid generator may be derived from a compound of the following Chemical Formula 11 or 12.

[Chemical Formula 11]

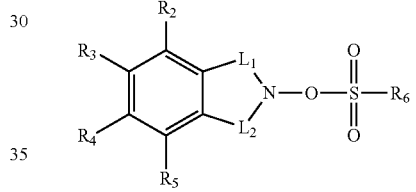

[Chemical Formula 12]

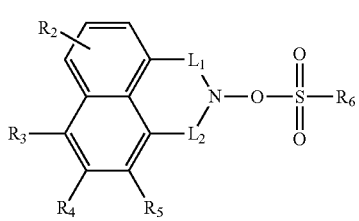

In Chemical Formulae 11 and 12, $R_2$ to $R_5$ are each independently hydrogen, a halogen, a thiol, a $C_{1-20}$ alkyl, a $C_{3-20}$ cycloalkyl, a $C_{2-20}$ alkenyl, a $C_{1-20}$ alkoxy, a $C_{1-10}$ fluoroalkyl, a $C_{1-20}$ alkylthiol, or a $C_{2-20}$ alkenethiol, at least one of $R_3$ to $R_5$ is a thiol, a $C_{2-20}$ alkenyl, or a $C_{2-20}$ alkenethiol, $R_6$ is a $C_{1-10}$ alkoxy, a $C_{1-10}$ fluoroalkyl, or a $C_{1-10}$ alkylthiol, $L_1$ is a substituted or unsubstituted $C_{1-4}$ alkylene containing a carbonyl linked to the nitrogen atom, and $L_2$ is carbonyl or methylene.

Specifically, in Chemical Formulae 11 and 12, $R_2$, $R_4$, and $R_5$ are each independently hydrogen, $R_3$ may be a thiol, a $C_{2-20}$ alkenyl, or a $C_{2-20}$ alkenethiol, preferably, $R_2$, $R_4$, and $R_5$ are each independently hydrogen, and $R_3$ may be a thiol or ethylenyl.

Further, in Chemical Formulae 11 and 12, $R_6$ may be a $C_{1-10}$ fluoroalkyl, and preferably, $R_6$ may be trifluoromethyl.

Further, in Chemical Formulae 11 and 12, $L_1$ may be carbonyl and $L_2$ may be carbonyl. On the other hand, the photo-acid generating group contained in the polymeric photo-acid generator may be derived from any one of compounds represented by the following Chemical Formulae 13 to 15.

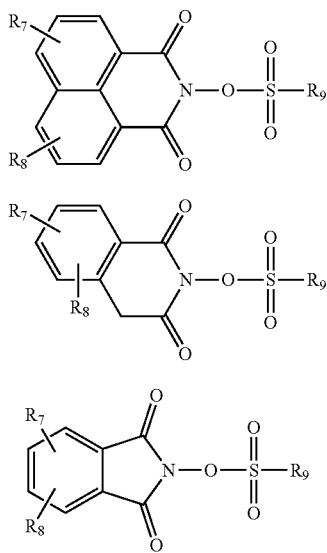

[Chemical Formula 13]

[Chemical Formula 14]

[Chemical Formula 15]

In Chemical Formulae 13 to 15, $R_7$ and $R_8$ are each independently hydrogen, a halogen, a thiol, a $C_{1-20}$ alkyl, a $C_{3-20}$ cycloalkyl, a $C_{2-20}$ alkenyl, a $C_{1-20}$ alkoxy, a $C_{1-10}$ fluoroalkyl, a $C_{1-20}$ alkylthiol, or a $C_{2-20}$ alkenethiol, at least one of the $R_7$ and $R_8$ is a thiol, a $C_{2-20}$ alkenyl, or a $C_{2-20}$ alkenethiol, and $R_9$ is a $C_{1-10}$ alkoxy, a $C_{1-10}$ fluoroalkyl, or a $C_{1-10}$ alkyl thiol.

Specifically, in Chemical Formulae 13 to 15, $R_7$ is a thiol or a $C_{2-20}$ alkenyl, and $R_8$ is hydrogen.

Preferably, $R_7$ is a thiol or ethylenyl, and $R_8$ is hydrogen.

Further, in Chemical Formulae 13 to 15, $R_9$ may be a $C_{1-10}$ fluoroalkyl, and $R_6$ may be trifluoromethyl.

On the other hand, as described above, the polymeric photo-acid generator has a structure in which a photo-acid generating group is linked with a second alkali-soluble resin via a functional group containing a $C_{1-20}$ alkylene sulfide, whereby any one of the compounds derived from the second alkali-soluble resin and the photo-acid generating group may include a functional group containing a double bond, and the other may include a functional group containing a thiol, thereby forming the functional group containing a $C_{1-20}$ alkylene sulfide.

More specifically, any one of the second alkali-soluble resin and the compound of Chemical Formula 11 or 12 may include a functional group containing a double bond, and the other may include a functional group containing a thiol.

The range of the molecular weight of each of the first alkali-soluble resin and the polymeric photo-acid generator is not particularly limited, but for example, it may have a weight average molecular weight of 1000 to 500,000.

Herein, the weight average molecular weight means a weight average molecular weight in terms of polystyrene as measured by the GPC method.

In the process of measuring the weight average molecular weight in terms of polystyrene by GPC, commonly known analysis equipment, detectors such as a refractive index detector, etc., and columns for analysis may be used, and commonly applied temperature conditions, solvents, and flow rates may be applied.

Specific examples of the measurement conditions may include a temperature of 30° C., a chloroform solvent, and a flow rate of 1 mL/min.

Meanwhile, the chemically amplified photoresist composition according to the embodiment may further include a photo-initiator.

As the photo-initiator, those commonly used in the relevant technical field can be used and are not particularly limited.

The photo-initiator is, for example, selected from benzophenone, aromatic α-hydroxy ketone, benzyl ketal, aromatic α-aminoketone, a phenylglyoxalic acid ester, a monoacylphosphine oxide, a bis-acylphosphine oxide, a tris-acylphosphine oxide, an aromatic ketone-derived oxime ester, and/or a carbazole oxime ester.

The photo-initiator may be used in the process of preparing the photo-acid generator, or may be used in such a form that it is charged together with the photo-acid generating group after polymerizing the second alkali-soluble resin.

Further, the chemically amplified photoresist composition may include an acid diffusion inhibitor, a corrosion inhibitor, a dissolution inhibitor, a solvent, and the like, in addition to the above components.

The acid diffusion control agent may be included for improving the resist pattern shape, stability after exposure, etc., and examples thereof include at least one selected from the group consisting of triethylamine, tripropyl amine, tribenzyl amine, trihydroxyethyl amine, and ethylene diamine.

The corrosion inhibitor plays a role of minimizing the extent to which the photoresist stripping composition corrodes a metal pattern, and those commonly used in the art can be used and are not particularly limited.

On the other hand, the corrosion inhibitor may be, for example, a triazole-based compound, gallic acid (GA), or a mixture thereof.

The corrosion inhibitor can be physically and chemically adsorbed to the metal constituting a metal pattern to prevent corrosion of the metal pattern.

For example, the triazole-based compound includes a benzotriazole (BTA) compound and a tolytriazole (TTA).

On the other hand, as the dissolution inhibitor, those commonly known in the art can be used and are not particularly limited.

The solvent may be included for homogeneously dissolving and mixing various components and controlling the viscosity of the photoresist composition. The solvent may be, for example, ketones such as acetone, methyl ethyl ketone, cyclohexanone, methyl isoamyl ketone, and 2-heptanone; polyhydric alcohols such as monomethyl ether, monoethyl ether, monopropyl ether, monobutyl ether, or a monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate, and derivatives thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, or 3-methyl-3-methoxybutyl acetate; or aromatic hydrocarbons such as toluene and xylene. These solvents may be used alone or in combination of two or more.

On the other hand, in the chemically amplified photoresist composition, the photo-acid generator may be contained in an amount of 0.01 to 50 parts by weight, preferably 0.5 to 40 parts by weight, and more preferably 1 to 30 parts by weight, based on 100 parts by weight of the first alkali-soluble resin.

When the chemically amplified photoresist composition contains the above components within the above range, the sensitivity can be effectively increased by only a small equivalent weight of the photo-acid generator, and the occurrence of scum in the exposed area due to excessive use of the photo-acid generator can be prevented during development, which is suitable for achieving the objects of the present invention.

On the other hand, according to another embodiment of the present invention, a photoresist pattern produced from the chemically amplified photoresist composition is provided.

As described above, the use of the chemically amplified photoresist composition of one embodiment can improve the compatibility between an alkali-soluble resin and a photo-acid generator and the solubility of the photo-acid generator, and also effectively increase the sensitivity even if a small amount of a photo-acid generator is used, and thus prevent the occurrence of scum in the exposed area due to excessive use of the photo-acid generator during development, and further improve resistance to a leaching phenomenon in which a low-molecular substance leaks out into a plating solution. Accordingly, the photoresist pattern provided from the chemically amplified photoresist composition can have homogeneous and excellent quality together with more improved sensitivity.

Meanwhile, according to another embodiment of the present invention, a method for preparing a photoresist pattern using the chemically amplified photoresist composition of one embodiment is provided.

More specifically, the method for preparing a photoresist pattern includes: a lamination step of laminating a thick film photoresist layer composed of the chemically amplified photoresist composition on a support; an exposure step of irradiating the thick film photoresist layer with radiation including an electromagnetic wave or a particle beam; and a development step of developing the thick film photoresist layer after exposure to obtain a thick film resist pattern.

In the method for preparing the photoresist pattern, a method and an apparatus known as those which can be used in the process of preparing a photoresist pattern can be used without particular limitation.

Advantageous Effects

According to the present invention, a chemically amplified photoresist composition which can improve compatibility between an alkali-soluble resin and a photo-acid generator and the solubility of the photo-acid generator, and thus effectively increase the sensitivity even if a small amount of a photo-acid generator is used, prevent the occurrence of scum in the exposed area due to excessive use of the photo-acid generator during development, and further improve resistance to a leaching phenomenon in which a low-molecular substance leaks out into a plating solution, can be provided.

In addition, according to the present invention, a photoresist pattern produced from the above-described chemically amplified photoresist composition, and a method for preparing a photoresist pattern using the above-described chemically amplified photoresist composition, can be provided.

DETAILED DESCRIPTION OF THE EMBODIMENTS

Hereinafter, the present invention will be described in more detail to help understanding of the present invention. However, the following examples are presented for illustrative purposes only, and the scope of the present invention is not limited thereto.

EXAMPLES AND COMPARATIVE EXAMPLE

Preparation of Chemically Amplified Photoresist Composition

Example 1 tert-butyl methacrylate, methacrylic acid, 2-(allyloxy)ethyl methacrylate, dicyclopentanyl methacrylate (FA-513M), 1-dodecanethiol, and PGMEA (solvent) were added to a reactor in amounts of 95.58 g, 14.47 g, 85.86 g, 74.09 g, 2.19 g, and 320.09 g, respectively, to make a homogenous solution.

The internal temperature of the solution was set to 65° C. under a nitrogen atmosphere, and then 1.62 g of AIBN was dissolved in 14.58 g of PGMEA and this solution was added.

After reaction for 18 hours, the polymerization reaction was terminated to obtain a second alkali-soluble resin (Mw: 25.2k) represented by the following Chemical Formula 16.

137.8 g of AIBN and 209.4 g of a photo-acid generating group of the following Chemical Formula 17 (6-mercapto-1,3-dioxo-1H-benzo[de]isoquinolin-2(3H)-yl trifluoromethanesulfonate) were additionally added to the reactor.

A thiol-ene click reaction was carried out at 65° C. which is the same as the polymerization temperature for 3 hours to prepare a polymeric photo-acid generator of the following Chemical Formula 18 in which the second alkali-soluble resin and the photo-acid generating group were linked with each other via an ethylene sulfide group. When the reaction was completed, the temperature was lowered to room temperature, and the solution was diluted with IPA and PGMEA and poured into water and precipitated.

Filtration was performed and the obtained polymer was poured again into a mixed solvent of IPA and PGMEA, precipitated, filtered, and dried in an oven at 40° C. for one day.

45 g of the first alkali-soluble resin (Mw: 25.1k) of the following Chemical Formula 22 and 4.5 g of the polymeric photo-acid generator of the following Chemical Formula 18 were mixed, and then additionally, 0.5 g of an acid diffusion inhibitor as an additive and 50 g of PGMEA as a solvent were mixed and stirred at room temperature to prepare a homogeneous solution, thereby obtaining a chemically amplified photoresist composition.

[Chemical Formula 16]

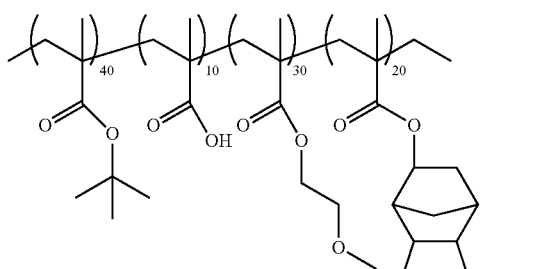

[Chemical Formula 17]

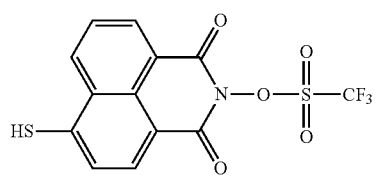

[Chemical Formula 18]

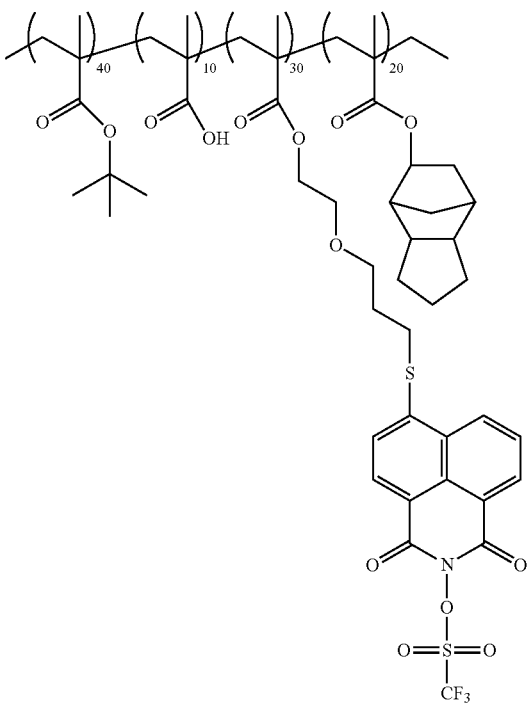

Example 2

The second alkali-soluble resin represented by Chemical Formula 16 and having a molecular weight of 3068 was polymerized in the same manner as in Example 1, except that the amount (2.19 g) of 1-dodecanethiol added during the polymerization was changed to 29.7 g.

A thiol-ene click reaction was carried out to prepare a polymeric photo-acid generator of the above Chemical Formula 18 in which the low molecular weight second alkali-soluble resin and the photo-acid generating group were linked with each other via an ethylene sulfide functional group.

A chemically amplified photoresist composition was prepared through the same process as in Example 1, except that the polymeric photo-acid generator linked with the second alkali-soluble resin having a molecular weight of 3068 was used.

Example 3 tert-butyl methacrylate, methacrylic acid, mercaptomethyl methacrylate, dicyclopentanyl methacrylate (FA-513M), 1-dodecanethiol, and PGMEA (solvent) were added to a reactor in amounts of 95.61 g, 14.47 g, 66.66 g, 74.06 g, 2.54 g, and 297 g, respectively, to make a homogenous solution.

The internal temperature of the solution was set to 65° C. under a nitrogen atmosphere, and then 1.62 g of AIBN was dissolved in 14.58 g of PGMEA and this solution was added.

After reaction for 18 hours, the polymerization reaction was terminated to obtain a second alkali-soluble resin (Mw: 25.1k) represented by the following Chemical Formula 19.

137.79 g of AIBN and 205.98 g of a photo-acid generating group of the following Chemical Formula 20 (1,3-dioxo-6-vinyl-1H-benzo[de]isoquinolin-2(3H)-yl trifluoromethanesulfonate) were additionally added to the reactor.

A thiol-ene click reaction was carried out at 65° C. which is the same as the polymerization temperature for 3 hours to prepare a polymeric photo-acid generator of the following Chemical Formula 21 in which the second alkali-soluble resin and the photo-acid generating group were linked with each other via an ethylene sulfide functional group.

When the reaction was completed, the temperature was lowered to room temperature, and the solution was diluted with IPA and PGMEA and poured into water and precipitated.

Filtration was performed, and the obtained polymer was poured again into a mixed solvent of IPA and PGMEA, precipitated, filtered, and dried in an oven at 40° C. for one day.

45 g of a first alkali-soluble resin (Mw: 25.1k) of the following Chemical Formula 22 and 4.5 g of a polymeric photo-acid generator of the following Chemical Formula 21 were mixed, and then additionally, 0.5 g of an acid diffusion inhibitor as an additive and 50 g of PGMEA as a solvent were mixed and stirred at room temperature to prepare a homogeneous solution, thereby obtaining a chemically amplified photoresist composition.

[Chemical Formula 19]

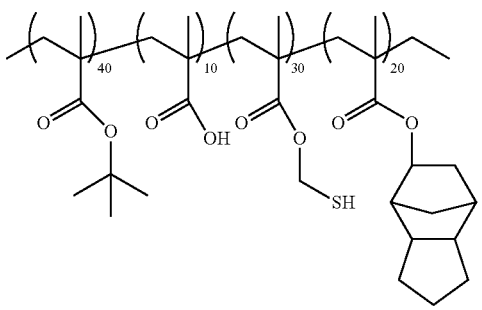

-continued

[Chemical Formula 20]

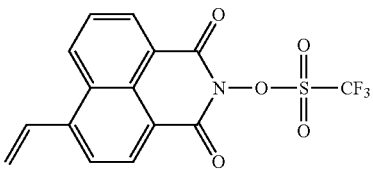

[Chemical Formula 21]

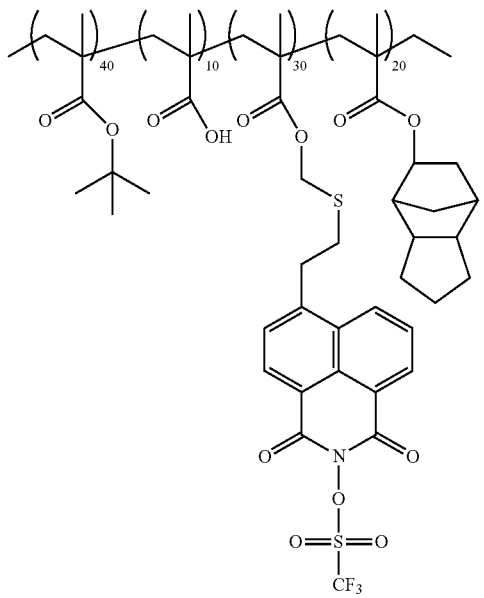

Example 4

The second alkali-soluble resin represented by Chemical Formula 19 and having a molecular weight of 3021 was polymerized in the same manner as in Example 3, except that the amount (2.54 g) of 1-dodecanethiol added during the polymerization was changed to 29.7 g.

A thiol-ene click reaction was carried out to prepare a polymeric photo-acid generator of the above Chemical Formula 21 in which the low molecular weight second alkali-soluble resin and the photo-acid generating group were linked with each other via an ethylene sulfide functional group.

A chemically amplified photoresist composition was prepared through the same process as in Example 3, except that the polymeric photo-acid generator linked with the second alkali-soluble resin having a molecular weight of 3068 was used.

Comparative Example 1

46.7 g of an acrylic resin (Mw: 25.1k) represented by the following Chemical Formula 22 as the first alkali-soluble resin, and 3 g of trifluoromethylsulfonyloxy-1,8-naphthalimide represented by the following Chemical Formula 23 as a photo-acid generator were mixed, and then additionally, 0.3 g of an acid diffusion inhibitor as an additional additive and 50 g of PGMEA as a solvent were mixed and stirred at room temperature to prepare a homogeneous solution, thereby obtaining a chemically amplified photoresist composition.

[Chemical Formula 22]

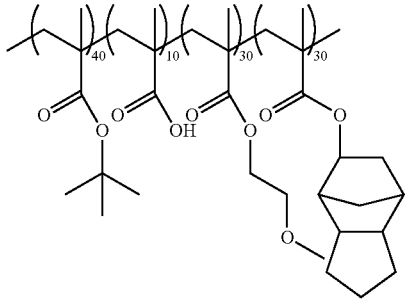

[Chemical Formula 23]

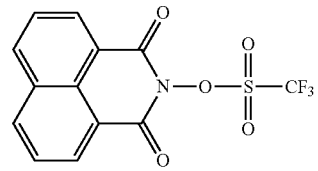

Experimental Example

1) Evaluation of Solubility 0.1 g of propylene glycol methyl ether acetate was added to 0.5 g of each of the chemically amplified photoresist compositions prepared according to Examples 1 to 4 and the chemically amplified photoresist composition according to Comparative Example 1 and dissolved. The solubility was measured, and the results are shown in Table 1 below.

TABLE 1

|  | First alkali-soluble resin | Molecular weight of alkali-soluble resin (unit: Mw) | Polymeric photo-acid generator (unit: Mw) | Solubility |
| --- | --- | --- | --- | --- |
| Example 1 | Compound of Chemical Formula 22 | 25.1k | Compound of Chemical Formula 18 (25.2k) | ○ |
| Example 2 | Compound of Chemical Formula 22 | 25.1k | Compound of Chemical Formula 18 (3k) | Δ |
| Example 3 | Compound of Chemical Formula 22 | 25.1k | Compound of Chemical Formula 21 (25.1k) | ○ |
| Example 4 | Compound of Chemical Formula 22 | 25.1k | Compound of Chemical Formula 21 (3k) | Δ |

TABLE 1-continued

|  | First alkali-soluble resin | Molecular weight of alkali-soluble resin (unit: Mw) | Polymeric photo-acid generator (unit: Mw) | Solubility |
|---|---|---|---|---|
| Comparative Example 1 | Compound of Chemical Formula 22 | 25.1k | Compound of Chemical Formula 23 | X |

○: 10 wt % or more dissolved in PGMEA/Δ: 5 to 10 wt % dissolved in PGMEA/X: 5 wt % or less dissolved in PGMEA.

From the results shown in Table 1, it can be confirmed that in the case of the photoresist compositions of Examples 1 to 4 of the present invention including a polymeric photo-acid generator in which a second alkali-soluble resin and a photo-acid generating group were linked with each other via an ethylene sulfide functional group, it has improved solubility as compared with Comparative Example 1.

2) Evaluation of Leaching Phenomenon during Plating

The photoresist compositions prepared in Examples 1 to 4 and Comparative Example 1 were applied onto a substrate using a spin coater, and then underwent steps such as prebake and postbake to form a resist film, which was immersed in a Cu plating solution at room temperature for 2 hours. Subsequently, it was investigated whether there was a leaching phenomenon through the change in the thickness of the resist film.

When the thickness difference was more than 5%, it was considered that there was a leaching phenomenon, and the experimental results are shown in Table 2 below.

|  | First alkali-soluble resin | Molecular weight of alkali-soluble resin (unit: Mw) | Polymeric photo-acid generator (unit: Mw) | Leaching phenomenon during plating |
|---|---|---|---|---|
| Example 1 | Compound of Chemical Formula 22 | 25.1k | Compound of Chemical Formula 18 (25.2k) | Absence |
| Example 2 | Compound of Chemical Formula 22 | 25.1k | Compound of Chemical Formula 18 (3k) | Absence |
| Example 3 | Compound of Chemical Formula 22 | 25.1k | Compound of Chemical Formula 21 (25.1k) | Absence |
| Example 4 | Compound of Chemical Formula 22 | 25.1k | Compound of Chemical Formula 21 (3k) | Absence |
| Comparative Example 1 | Compound of Chemical Formula 22 | 25.1k | Compound of Chemical Formula 23 | Presence |

From the results shown in Table 2, it can be confirmed that in the case of the photoresist compositions of Examples 1 to 4 of the present invention including a compound in which a second alkali-soluble resin and a photo-acid generating group were linked with each other via an ethylene sulfide, it has an improved effect in terms of the suppression of a leaching phenomenon during plating as compared with Comparative Example 1.

The invention claimed is:

1. A chemically amplified photoresist composition comprising: a first alkali-soluble resin comprising a repeating unit; and
a polymeric photo-acid generator in which a photo-acid generating group is linked with a second alkali-soluble resin via a functional group containing a $C_{1-20}$ alkylene sulfide, wherein the photo-acid generating group is derived from a compound of the following Chemical Formulae 11 or 12, and wherein any one of the second alkali-soluble resin and the compound of the Chemical Formulae 11 or 12 includes a functional group containing a double bond, and the other includes a functional group containing a thiol:

[Chemical Formula 11]

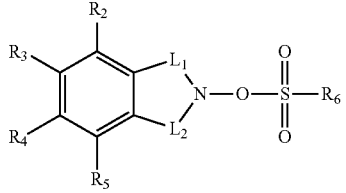

-continued

[Chemical Formula 12]

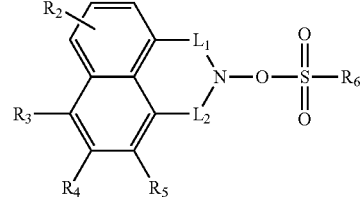

wherein, in the Chemical Formulae 11 and 12,
$R_2$ to $R_5$ are each independently hydrogen, a halogen, a thiol, a $C_{1-20}$ alkyl, a $C_{3-20}$ cycloalkyl, a $C_{2-20}$ alkenyl, a $C_{1-20}$ alkoxy, a $C_{1-10}$ fluoroalkyl, a $C_{1-20}$ alkylthiol, or a $C_{2-20}$ alkenethiol,
at least one of $R_3$ to $R_5$ is a thiol, a $C_{2-20}$ alkenyl, or a $C_{2-20}$ alkenethiol, $R_6$ is a $C_{1-10}$ alkoxy, a $C_{1-10}$ fluoroalkyl, or a $C_{1-10}$ alkylthiol, $L_1$ is a substituted or unsubstituted $C_{1-4}$ alkylene containing a carbonyl linked to the nitrogen atom, and $L_2$ is carbonyl or methylene.

2. The chemically amplified photoresist composition according to claim 1, wherein each of the first alkali-soluble resin and the second alkali-soluble resin is at least one selected from the group of an acrylic resin, a novolac resin, and a polyhydroxystyrene resin.

3. The chemically amplified photoresist composition according to claim 1, wherein the second alkali-soluble resin contained in the polymeric photo-acid generator is the same as the first alkali-soluble resin or contains a repeating unit that is the same repeating unit of the first alkali-soluble resin.

4. The chemically amplified photoresist composition according to claim 1, wherein the composition contains 0.01 to 50 parts by weight of the polymeric photo-acid generator, based on 100 parts by weight of the first alkali-soluble resin.

5. The chemically amplified photoresist composition according to claim 1, wherein the second alkali-soluble resin includes a structure derived from any one or more of monomers represented by the following Chemical Formulae 1 to 10:

[Chemical Formula 1]

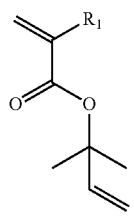

[Chemical Formula 2]

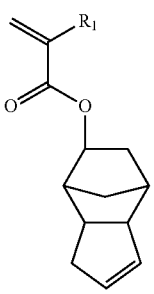

[Chemical Formula 3]

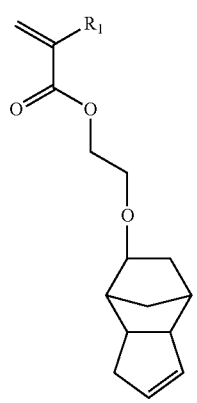

-continued

[Chemical Formula 4]

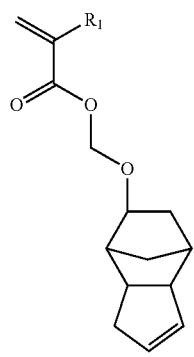

[Chemical Formula 5]

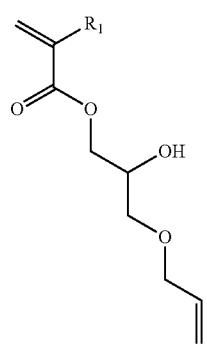

[Chemical Formula 6]

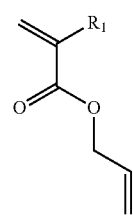

[Chemical Formula 7]

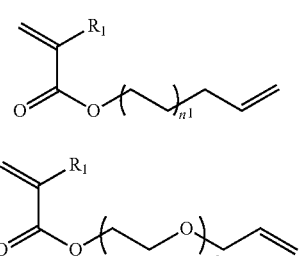

[Chemical Formula 8]

[Chemical Formula 9]

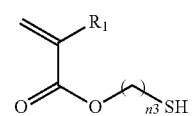

[Chemical Formula 10]

wherein, in Chemical Formulae 1 to 10,
R₁ is hydrogen, a halogen, a C_{1-10} alkyl, a C_{3-10} cycloalkyl, or a C_{2-10} alkenyl, and
n1, n2, and n3 are each independently an integer of 1 to 18.

6. The chemically amplified photoresist composition according to claim 1, wherein each of the first alkali-soluble resin and the polymeric photo-acid generator has a weight average molecular weight of 1000 to 500,000.

7. A chemically amplified photoresist composition comprising: a first alkali-soluble resin comprising a repeating unit; and
a polymeric photo-acid generator in which a photo-acid generating group is linked with a second alkali-soluble resin via a functional group containing a C_{1-20} alkylene sulfide,
wherein the photo-acid generating group is derived from any one of compounds represented by the following Chemical Formulae 13 to 15, and
wherein any one of the second alkali-soluble resin and the compound of the Chemical Formulae 13, 14 or 15 includes a functional group containing a double bond, and the other includes a functional group containing a thiol:

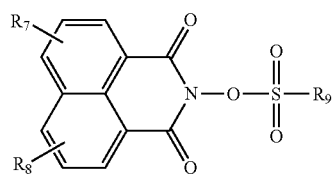

[Chemical Formula 13]

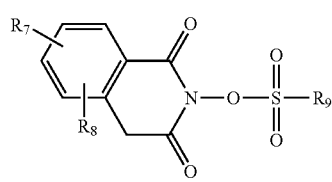

[Chemical Formula 14]

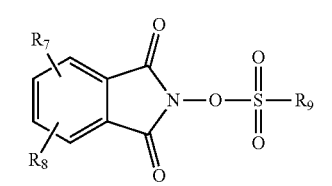

[Chemical Formula 15]

wherein, in Chemical Formulae 13 to 15,
R₇ and R₈ are each independently hydrogen, a halogen, a thiol, a C_{1-20} alkyl, a C_{3-20} cycloalkyl, a C_{2-20} alkenyl, a C_{1-20} alkoxy, a C_{1-10} fluoroalkyl, a C_{1-20} alkylthiol, or a C_{2-20} alkenethiol,
at least one of R₇ and R₈ is a thiol, a C_{2-20} alkenyl, or a C_{2-20} alkenethiol, and
R₉ is a C_{1-10} alkoxy, a C_{1-10} fluoroalkyl, or a C_{1-10} alkyl thiol.

8. The chemically amplified photoresist composition according to claim 7, wherein each of the first alkali-soluble resin and the second alkali-soluble resin is at least one selected from the group of an acrylic resin, a novolac resin, and a polyhydroxystyrene resin.

9. The chemically amplified photoresist composition according to claim 7, wherein the second alkali-soluble resin contained in the polymeric photo-acid generator is the same as the first alkali-soluble resin or contains a repeating unit that is the same repeating unit of the first alkali-soluble resin.

10. The chemically amplified photoresist composition according to claim 7, wherein the composition contains 0.01 to 50 parts by weight of the polymeric photo-acid generator, based on 100 parts by weight of the first alkali-soluble resin.

11. The chemically amplified photoresist composition according to claim 7, wherein the second alkali-soluble resin includes a structure derived from any one or more of monomers represented by the following Chemical Formulae 1 to 10:

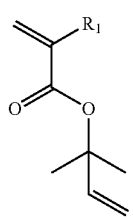

[Chemical Formula 1]

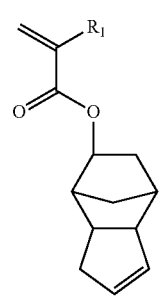

[Chemical Formula 2]

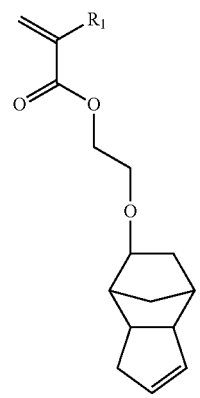

[Chemical Formula 3]

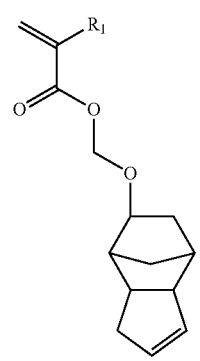

[Chemical Formula 4]

-continued

[Chemical Formula 5]

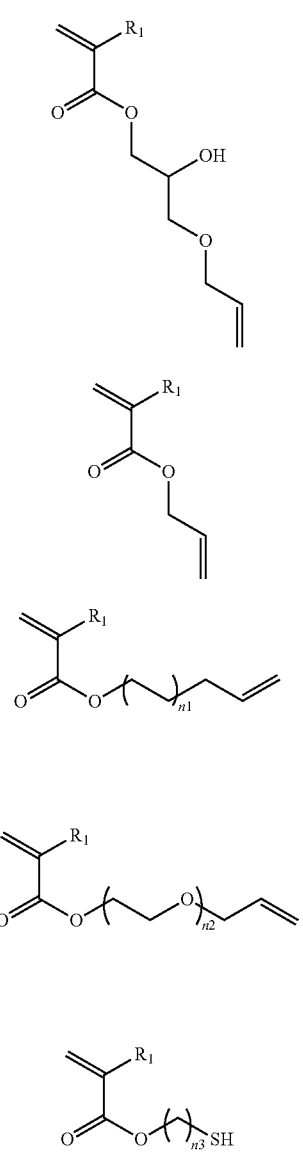

[Chemical Formula 6]

[Chemical Formula 7]

[Chemical Formula 8]

[Chemical Formula 9]

-continued

[Chemical Formula 10]

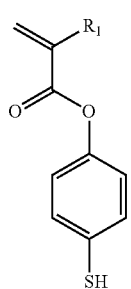

wherein, in Chemical Formulae 1 to 10,
$R_1$ is hydrogen, a halogen, a $C_{1-10}$ alkyl, a $C_{3-10}$ cycloalkyl, or a $C_{2-10}$ alkenyl, and
n1, n2, and n3 are each independently an integer of 1 to 18.

12. The chemically amplified photoresist composition according to claim 7, wherein each of the first alkali-soluble resin and the polymeric photo-acid generator has a weight average molecular weight of 1000 to 500,000.

13. A thick film photoresist pattern produced from the chemically amplified photoresist composition of claim 1.

14. A method for preparing a thick film photoresist pattern comprising the steps of: a lamination step of laminating a thick film photoresist layer comprising the chemically amplified photoresist composition of claim 1 on a support;
an exposure step of irradiating the thick film photoresist layer with radiation including an electromagnetic wave or a particle beam; and
a development step of developing the thick film photoresist layer after exposure to obtain a thick film photoresist pattern.

15. A thick film photoresist pattern produced from the chemically amplified photoresist composition of claim 7.

16. A method for preparing a thick film photoresist pattern comprising the steps of: a lamination step of laminating a thick film photoresist layer comprising the chemically amplified photoresist composition of claim 7 on a support;
an exposure step of irradiating the thick film photoresist layer with radiation including an electromagnetic wave or a particle beam; and
a development step of developing the thick film photoresist layer after exposure to obtain a thick film photoresist pattern.

* * * * *